(12) United States Patent
Le et al.

(10) Patent No.: US 11,309,487 B2
(45) Date of Patent: *Apr. 19, 2022

(54) SPIN TRANSFER TORQUE MRAM WITH A SPIN TORQUE OSCILLATOR STACK AND METHODS OF MAKING THE SAME

(71) Applicant: SANDISK TECHNOLOGIES LLC, Addison, TX (US)

(72) Inventors: Quang Le, San Jose, CA (US); Zhanjie Li, Pleasanton, CA (US); Zhigang Bai, Fremont, CA (US); Paul Vanderheijden, Cupertino, CA (US); Michael Ho, Redwood City, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 55 days.

This patent is subject to a terminal disclaimer.

(21) Appl. No.: 16/880,497

(22) Filed: May 21, 2020

(65) Prior Publication Data
US 2020/0287127 A1    Sep. 10, 2020

Related U.S. Application Data

(63) Continuation of application No. 16/212,420, filed on Dec. 6, 2018, now Pat. No. 10,811,596.

(51) Int. Cl.
*H01L 27/22* (2006.01)
*H01L 43/02* (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC ............................................ H01L 27/222–228
See application file for complete search history.

(56) References Cited

U.S. PATENT DOCUMENTS 7,813,202 B2    10/2010   Rodmacq et al.
7,826,258 B2    11/2010   Zhu et al.
(Continued)

FOREIGN PATENT DOCUMENTS

EP    2209123         7/2010
JP    2005150482      6/2005
(Continued)

OTHER PUBLICATIONS

Liu, T. et al., "Large Enhanced Perpendicular Magnetic Anisotropy in CoFeb/MgO System with the Typical Ta Buffer Replaced by an Hf Layer," AIP Advances, vol. 2, No. 032151, pp. 032151-1 to 032151-7, (2012).

(Continued)

*Primary Examiner* — Daniel P Shook
(74) *Attorney, Agent, or Firm* — The Marbury Law Group PLLC

(57) ABSTRACT

A MRAM cell includes a magnetic tunnel junction containing a reference layer having a fixed magnetization direction, a free layer, and a nonmagnetic tunnel barrier layer located between the reference layer and the free layer, a spin torque oscillator stack, and a first nonmagnetic spacer layer located between the free layer and the spin torque oscillator stack.

20 Claims, 9 Drawing Sheets

(51) Int. Cl.
  *H01L 43/10* (2006.01)
  *H01F 10/32* (2006.01)
  *G11C 11/16* (2006.01)
  *H01L 43/12* (2006.01)

(52) U.S. Cl.
  CPC ..... *H01F 10/3254* (2013.01); *H01F 10/3268* (2013.01); *H01L 27/222* (2013.01); *H01L 43/10* (2013.01); *G11C 11/1655* (2013.01); *G11C 11/1657* (2013.01); *G11C 11/1673* (2013.01); *H01L 43/12* (2013.01)

(56) References Cited

U.S. PATENT DOCUMENTS

| | | |
|---|---|---|
| 8,085,582 B2 | 12/2011 | Nakamura et al. |
| 8,357,982 B2 | 1/2013 | Kajiyama |
| 8,569,852 B2 | 10/2013 | Morise et al. |
| 8,716,817 B2 | 5/2014 | Saida et al. |
| 8,860,156 B2 | 10/2014 | Beach et al. |
| 8,917,543 B2 | 12/2014 | Ranjan et al. |
| 9,019,758 B2 | 4/2015 | Huai et al. |
| 9,025,368 B2 | 5/2015 | Saida et al. |
| 9,025,371 B1 | 5/2015 | Huai et al. |
| 9,166,150 B2 | 10/2015 | Doyle et al. |
| 9,281,040 B2 | 3/2016 | Soree et al. |
| 9,318,179 B2 | 4/2016 | Huai et al. |
| 9,419,210 B2 | 8/2016 | Huai et al. |
| 9,437,808 B2 | 9/2016 | Doyle et al. |
| 9,444,039 B2 | 9/2016 | Huai et al. |
| 9,460,397 B2 | 10/2016 | Apalkov et al. |
| 9,461,243 B2 | 10/2016 | Guo |
| 9,478,729 B2 | 10/2016 | Lee et al. |
| 9,537,090 B1 | 1/2017 | Hu |
| 9,620,706 B2 | 4/2017 | Lee et al. |
| 9,741,929 B2 | 8/2017 | Guo |
| 9,852,782 B2 | 12/2017 | Braganca et al. |
| 9,853,206 B2 | 12/2017 | Pinarbasi et al. |
| 9,978,935 B2 | 5/2018 | Hu |
| 10,229,723 B1 | 3/2019 | Choi et al. |
| 10,270,027 B1 * | 4/2019 | Gajek .............. H01L 43/08 |
| 10,354,710 B2 | 7/2019 | Petti et al. |
| 10,381,551 B1 | 8/2019 | Lille |
| 2002/0105823 A1 | 8/2002 | Redon et al. |
| 2007/0133263 A1 | 6/2007 | Haratani |
| 2009/0015958 A1 | 1/2009 | Nakamura et al. |
| 2009/0218645 A1 | 9/2009 | Ranjan et al. |
| 2009/0237987 A1 | 9/2009 | Zhu et al. |
| 2011/0007560 A1 | 1/2011 | Dieny et al. |
| 2011/0233697 A1 | 9/2011 | Kajiyama |
| 2011/0241139 A1 | 10/2011 | Yen et al. |
| 2012/0063218 A1 | 3/2012 | Huai et al. |
| 2012/0242438 A1 | 9/2012 | Morise et al. |
| 2012/0314490 A1 | 12/2012 | Okhi et al. |
| 2013/0069185 A1 | 3/2013 | Saida et al. |
| 2013/0181305 A1 | 7/2013 | Nakayama et al. |
| 2013/0258764 A1 | 10/2013 | Ranjan et al. |
| 2014/0070341 A1 | 3/2014 | Beach et al. |
| 2014/0110804 A1 | 4/2014 | Han et al. |
| 2014/0159175 A1 | 6/2014 | Lee et al. |
| 2014/0160835 A1 | 6/2014 | Soree et al. |
| 2014/0177326 A1 | 6/2014 | Doyle et al. |
| 2014/0217487 A1 | 8/2014 | Guo |
| 2014/0269037 A1 | 9/2014 | Saida et al. |
| 2015/0001656 A1 | 1/2015 | Beach et al. |
| 2015/0097159 A1 | 4/2015 | Apalkov et al. |
| 2015/0137293 A1 | 5/2015 | Huai et al. |
| 2015/0188035 A1 | 7/2015 | Huai et al. |
| 2015/0188036 A1 | 7/2015 | Huai et al. |
| 2015/0214275 A1 | 7/2015 | Hsueh et al. |
| 2015/0340595 A1 | 11/2015 | Lee et al. |
| 2016/0043302 A1 | 2/2016 | Doyle et al. |
| 2016/0155931 A1 | 6/2016 | Lee et al. |
| 2016/0197269 A1 | 7/2016 | Huai et al. |
| 2016/0315249 A1 | 10/2016 | Kardasz et al. |
| 2016/0336508 A1 | 11/2016 | Guo |
| 2016/0372656 A1 | 12/2016 | Pinarbasi et al. |
| 2016/0379698 A1 | 12/2016 | Saida et al. |
| 2016/0380188 A1 | 12/2016 | Hu |
| 2017/0062700 A1 | 3/2017 | Braganca et al. |
| 2017/0084830 A1 | 3/2017 | Hu |
| 2017/0294573 A1 | 10/2017 | Hu et al. |
| 2017/0372763 A1 | 12/2017 | Braganca et al. |
| 2018/0033954 A1 | 2/2018 | Aradhya et al. |
| 2018/0108391 A1 | 4/2018 | Braganca et al. |
| 2019/0027201 A1 | 1/2019 | Petti et al. |
| 2019/0080738 A1 | 3/2019 | Choi et al. |
| 2019/0103552 A1 | 4/2019 | Shiokawa et al. |
| 2019/0131517 A1 | 5/2019 | Shiokawa et al. |
| 2019/0165253 A1 | 5/2019 | Sun et al. |
| 2019/0207089 A1 | 7/2019 | Kardasz et al. |
| 2020/0006633 A1 | 1/2020 | Lille |
| 2020/0011943 A1 | 1/2020 | Zimmer et al. |

FOREIGN PATENT DOCUMENTS

| | | |
|---|---|---|
| JP | 2015176926 A | 10/2015 |
| KR | 20120027390 A | 3/2012 |
| KR | 20180018779 A | 2/2018 |

OTHER PUBLICATIONS

Ma, Z. et al., "Effect of 90 degree Domain Movement on the Piezoelectric Response of Patterned $PbZr_{0.2}Ti_{0.8}O_3/SrTiO_3/Si$ Heterostructures," Appl. Phys. Lett., vol. 87, No. 7, (Abstract Only), (2005), https://doi.org/10.1063/1.2012527.

Hunter, D. et al., "Giant magnetostriction in annealed $Co_{1-x}Fe_x$ thin-films," Nature Communications, Accepted Oct. 4, 2011, Published Nov. 1, 2011, DOI: 10.1038/ncomms1529, pp. 1-7, (2011).

Parkin, et al., "Systematic Variation of the Strength and Oscillation Period of Indirect Magnetic Exchange Coupling Through the 3d, 4d and 5d Transition Metals," Phys. Rev. Lett., vol. 67, No. 3598, (Abstract Only) (1991), https://doi.org/10.1103/PhysRevLett.67.3598.

Sambri, A. et al., "Epitaxial Piezoelectric Pb(Zr0.2Ti0.8)O3 Thin Films on Silicon for Energy Harvesting Devices," Smart Materials Research, vol. 2012, Article ID 426048, pp. 1-7, (2012).

USPTO Office Communication, Non-Final Office Action for U.S. Appl. No. 16/212,132, dated Nov. 29, 2019, 12 pages.

Notification of Transmittal of the International Search Report and Written Opinion of the International Search Authority for International Patent Application No. PCT/US2019/046783, dated Dec. 3, 2019, 10 pages.

USPTO Office Communication, Non-Final Office Action for U.S. Appl. No. 16/212,257, dated Dec. 13, 2019, 16 pages.

Notification of Transmittal of the International Search Report and Written Opinion of the International Search Authority for International Patent Application No. PCT/US2019/049189, dated Dec. 19, 2019, 16 pages.

USPTO Office Communication, Non-Final Office Action for U.S. Appl. No. 16/212,420, dated Nov. 27, 2019, 10 pages.

USPTO Office Communication, Non-Final Office Action for U.S. Appl. No. 16/212,342, dated May 21, 2020, 35 pages.

U.S. Appl. No. 16/212,132, filed Dec. 6, 2018, SanDisk Technologies LLC.

U.S. Appl. No. 16/212,257, filed Dec. 6, 2018, SanDisk Technologies LLC.

U.S. Appl. No. 16/212,342, filed Dec. 6, 2018, SanDisk Technologies LLC.

U.S. Appl. No. 16/880,393, filed May 21, 2020, SanDisk Technologies LLC.

Non-Final Office Action for U.S. Appl. No. 16/902,641, dated Jul. 9, 2020, 14 pages.

Sbiaa, R., et al., "Spin transfer switching enhancement in perpendicular anisotropy magnetic tunnel junctions with a canted in-plane spin polarizer", Journal of Applied Physics, vol. 105, No. 1, 013910, pp. 1-6, (Jan. 6, 2009).

\* cited by examiner

SPIN TRANSFER TORQUE MRAM WITH A SPIN TORQUE OSCILLATOR STACK AND METHODS OF MAKING THE SAME

FIELD

The present disclosure relates generally to the field of MRAM cells and specifically to a spin-transfer torque (STT) magnetoresistive random access memory (MRAM) with a spin torque layer and a spin polarization layer and methods of operating the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing torque to magnetize the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of a reference layer.

SUMMARY

According to an aspect of the present disclosure, a MRAM cell includes a magnetic tunnel junction containing a reference layer having a fixed magnetization direction, a free layer, and a nonmagnetic tunnel barrier layer located between the reference layer and the free layer, a spin torque oscillator stack, and a first nonmagnetic spacer layer located between the free layer and the a spin torque oscillator stack.

DETAILED DESCRIPTION

Figure 1:
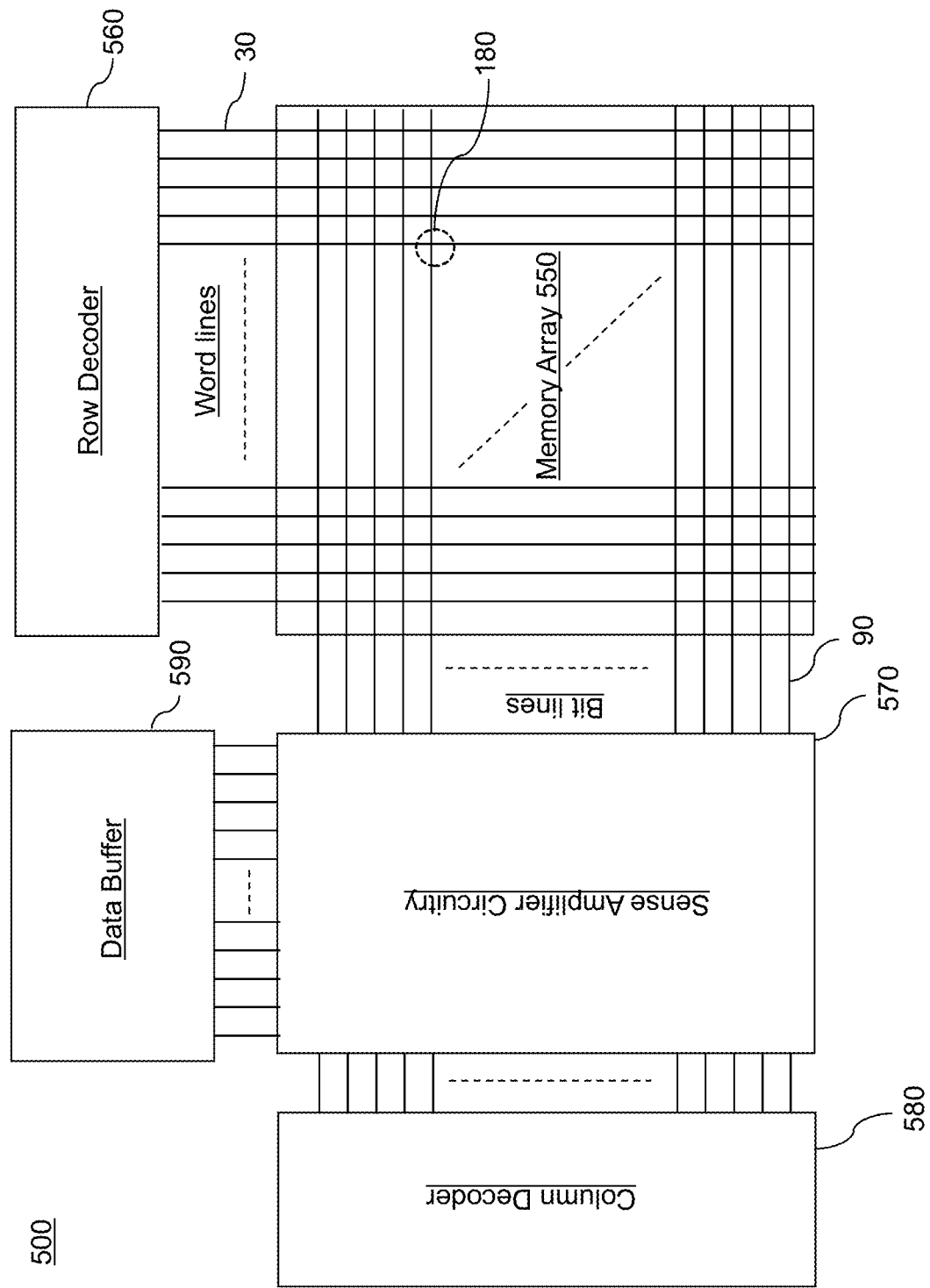
FIG. 1 is a schematic diagram of a memory device including MRAM cells of an embodiment of the present disclosure in an array configuration.

As discussed above, the present disclosure is directed to an MRAM cell containing a spin torque layer and a spin polarization layer and methods of operating the same, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

Referring to FIG. 1, a schematic diagram is shown for a magnetic memory device including memory cells 180 of an embodiment present disclosure in an array configuration. The magnetic memory device can be configured as a MRAM device 500 containing MRAM cells 180. As used herein, a "MRAM device" refers to a memory device containing cells that allow random access, e.g., access to any selected memory cell upon a command for reading the contents of the selected memory cell.

The MRAM device 500 of an embodiment of the present disclosure includes a memory array region 550 containing an array of the respective MRAM cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
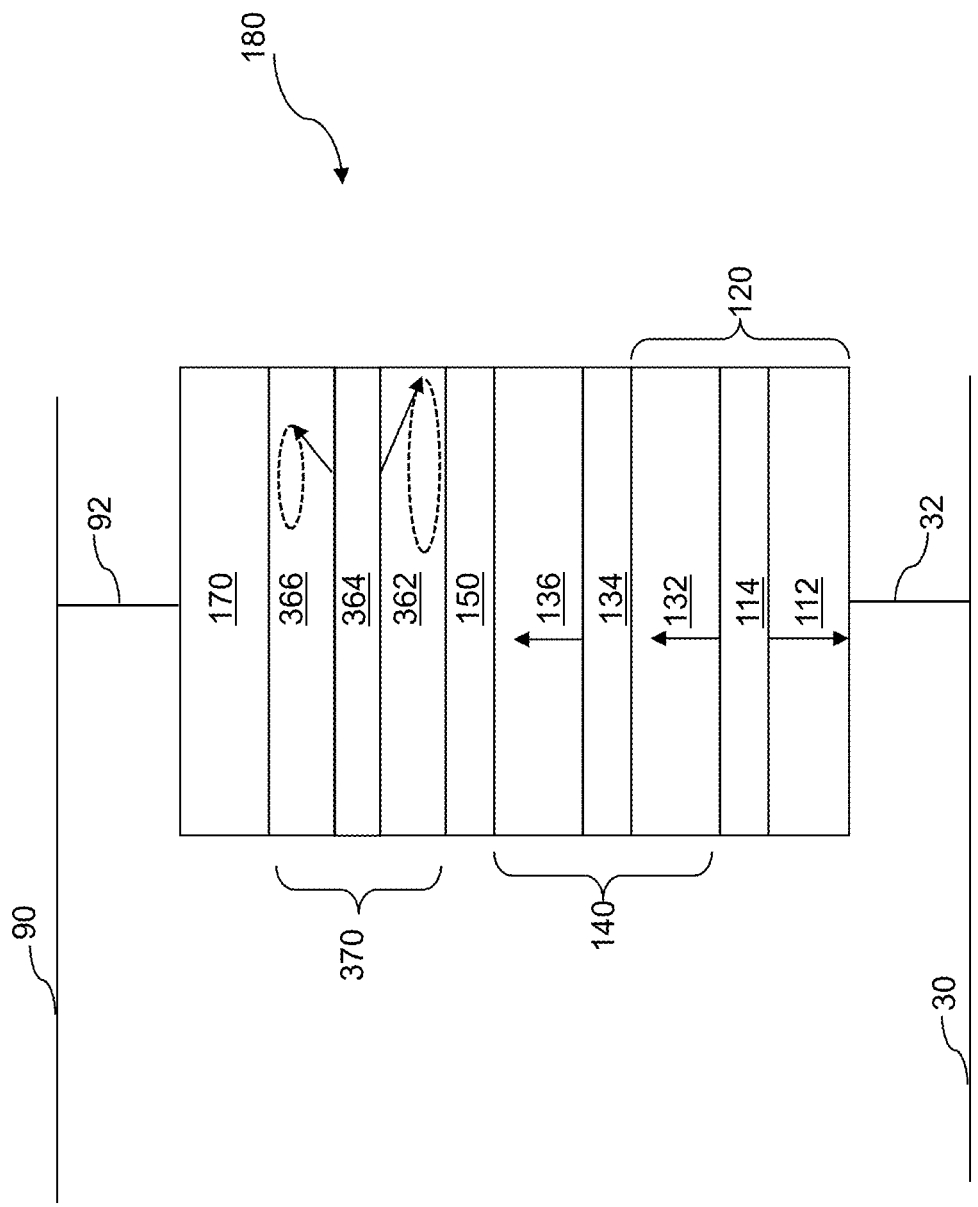
FIG. 2 illustrates a first configuration of an exemplary STT MRAM cell according to an embodiment of the present disclosure.

Referring to FIG. 2, a first configuration of an exemplary STT MRAM cell 180 is schematically illustrated. The STT MRAM cell 180 includes a magnetic tunnel junction (MTJ) 140. The magnetic tunnel junction 140 includes a reference layer 132 having a fixed vertical magnetization, a nonmagnetic tunnel barrier layer 134 located between the reference layer 132 and the free layer 136. In one embodiment, the reference layer 132 is located below the nonmagnetic tunnel barrier layer 134, while the free layer 136 is located above the nonmagnetic tunnel barrier layer 134. However, in other embodiments, the reference layer 132 is located above the nonmagnetic tunnel barrier layer 134, while the free layer 136 is located below the nonmagnetic tunnel barrier layer 134, or the reference layer 132 and the free layer 136 may be located on opposite lateral sides nonmagnetic tunnel barrier layer 134. In one embodiment, the reference layer 132 and the free layer 136 have respective positive uniaxial magnetic anisotropy.

Generally, a magnetic thin film has magnetic energy per unit volume that depends on the orientation of the magnetization of the material within the magnetic thin film. The magnetic energy per unit volume can be approximated by a polynomial of the angle $\theta$ (or of $\sin^2\theta$) between the direction of the magnetization and the vertical axis that is perpendicular to the plane of the magnetic thin film (such as a top surface or a bottom surface of the magnetic thin film) and the azimuthal angle between the direction of magnetization and a fixed vertical plane that is perpendicular to the plane of the magnetic thin film. The first and second order terms for the magnetic energy per unit volume as a function of $\sin^2\theta$ includes $K_1 \sin^2\theta + K_2 \sin^4\theta$. When $K_1$ is negative and $K_2$ is less than $-K_1/2$, the function $K_1 \sin^2\theta + K_2 \sin^4\theta$ has a minimum when $\theta$ is at $\pi/2$. If the magnetic anisotropy energy as a function of $\theta$ has a minimum only when $\theta$ is at $\pi/2$, the magnetization of the magnetic film is entirely within the plane of the film, and the film is said to have "negative uniaxial magnetic anisotropy." If the magnetic anisotropy energy as a function of $\theta$ has a minimum only when $\theta$ is at 0 or $\pi$, the magnetization of the magnetic film prefers to stay perpendicular to the plane of the film, and the film is said to have "positive uniaxial magnetic anisotropy." A thin crystalline magnetic film having positive uniaxial magnetic anisotropy has a magnetization that tends to stay perpendicular to the plane of the thin crystalline magnetic film, i.e., perpendicular to the two directions along which the thin crystalline magnetic film laterally extends. A thin crystalline magnetic film having negative uniaxial magnetic anisotropy has a tendency for magnetization to stay within the plane of the thin crystalline magnetic film, although within the film plane magnetization doesn't have a preferred orientation.

The configuration in which the reference layer 132 and the free layer 136 have respective positive uniaxial magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

The reference layer 132 can include either a Co/Ni or Co/Pt multilayer structure. The reference layer 132 can additionally include a thin nonmagnetic layer comprised of tantalum having a thickness of 0.2 nm~0.5 nm and a thin CoFeB layer (having a thickness in a range from 0.5 nm to 3 nm). The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm. The free layer 136 can includes alloys of one or more of Fe, Co, and/or Ni, such as CoFeB, at a composition that provides positive uniaxial magnetic anisotropy.

In one embodiment, the reference layer 132 may be provided as a component within a synthetic antiferromagnetic structure (SAF structure) 120. The SAF structure 120 can include the reference layer 132, a fixed ferromagnetic layer 112 having a magnetization that is antiparallel to the fixed vertical magnetization, and an antiferromagnetic coupling layer 114 located between the reference layer 132 and the fixed ferromagnetic layer 112 facing the first side of the reference layer 132 opposite to the second side of the reference layer 132 which faces the nonmagnetic tunnel barrier layer 134. The antiferromagnetic coupling layer 114 has a thickness that induces an antiferromagnetic coupling between the reference layer 132 and the fixed ferromagnetic layer 112. In other words, the antiferromagnetic coupling layer 114 can lock in the antiferromagnetic alignment between the magnetization of the reference layer 132 and the magnetization of the fixed ferromagnetic layer 112 to lock in place the magnetizations of the reference layer 132 and the magnetization of the fixed ferromagnetic layer 112. In one embodiment, the antiferromagnetic coupling layer can include ruthenium and can have a thickness in a range from 0.3 nm to 1 nm.

A first nonmagnetic spacer layer 150 is provided over the second side of the free layer 136 opposite to the first side of the free layer 136 which faces the nonmagnetic tunnel barrier layer 134. The first nonmagnetic spacer layer 150 includes a nonmagnetic material. The first nonmagnetic spacer layer 150 can include an electrically insulating (i.e., dielectric material) such as magnesium oxide. Alternatively, the first nonmagnetic spacer layer 150 can include an electrically conductive metallic material, such as tantalum, ruthenium, tantalum nitride, copper, or copper nitride. The thickness of the first nonmagnetic spacer layer 150 can be in a range from 0.2 nm to 2 nm, although lesser and greater thicknesses can also be employed.

A spin torque layer 362 can be provided on the first nonmagnetic spacer layer 150. In the first embodiment shown in FIG. 2, the spin torque layer 362 includes a first magnetic material having a first conical magnetization (e.g., magnetization direction) with respect to a vertical direction that is parallel to the fixed vertical magnetization (e.g., magnetization direction) of the reference layer 132. As used herein, a "conical magnetization" refers to a rotating magnetization (e.g., magnetization direction) having an angle greater than zero but less than 90 degrees, such as 10 to 80 degrees, for example 30 to 60 degrees with respect to an axis parallel to the fixed vertical magnetization (e.g., magnetization direction) of the reference layer 132.

A conical magnetization can be provided for various symmetry types for the magnetic anisotropy energy per volume. For example, a ferromagnetic film having magnetic anisotropy energy per volume having an axis of sixfold rotational symmetry about a vertical axis perpendicular to the plane of the ferromagnetic film can have a functional dependence on the tilt angle θ from the vertical axis and the azimuthal angle φ in the form of: $E/V = K_1 \sin^2\theta + K_2 \sin^4\theta + K_3 \sin^6\theta \cos(6\phi)$. If $K_1$ is negative and $K_2$ is greater than $K_1/2$, the ferromagnetic film has a bidirectional cone of easy magnetization direction at two values of q. The cone angles $\theta_{c1}$ and $\theta_{c2}$ for the bidirectional cone of easy magnetization direction are related by $\theta_{c2} = \pi - \theta_{c1}$.

Ferromagnetic films having different magnetic anisotropy symmetry can provide a conical magnetization is a similar manner. For example, a ferromagnetic film having magnetic anisotropy energy per volume having a tetrahedral symmetry can have a functional dependence on the tilt angle θ from the vertical axis and the azimuthal angle φ in the form of: $E/V = K_1 \sin^2\theta + K_2 \sin^4\theta + K_3 \sin^4\theta \sin(2\theta)$. A ferromagnetic film having magnetic anisotropy energy per volume having a rhombohedral symmetry can have a functional dependence on the tilt angle θ from the vertical axis and the azimuthal angle in the form of: $E/V = K_1 \sin^2\theta + K_2 \sin^4\theta + K_3 \cos\theta \sin^3\theta \cos(3\theta)$. If the value of $K_3$ is zero or insignificant compared to $\frac{1}{2} k_B T$ in which $k_B$ is the Boltzmann constant and T is room temperature in Kelvin, i.e., 293.15 in the magnetic anisotropy energy per volume, the conical magnetization is free to rotate (e.g., oscillate with a high frequency) around the vertical axis.

In one embodiment, the azimuthally-dependent component of the magnetic anisotropy of the spin torque layer 362 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy energy per unit volume around a vertical axis that is parallel to the fixed vertical magnetization of the reference layer 132 can be less than ½ times the thermal energy at room temperature. In such cases, the conical magnetization of the spin torque layer 362 is free to precess within the horizontal plane that is parallel to the interface between the first nonmagnetic spacer layer 150 and the spin torque layer 362 upon application of electrical current through the spin torque layer 362. In one embodiment, the magnetic energy of the spin torque layer 362 may be invariant under rotation of the magnetization of the spin torque layer 362 within the horizontal plane.

The spin torque layer 362 can include any ferromagnetic film that provides a conical magnetization. For example, the spin torque layer 362 can include a conical magnetization material such as rare-earth elements such as neodymium, erbium, or alloys of at least one rare-earth magnetic element and non-rare-earth element such as iron, boron, cobalt, copper, and/or zirconium. In one embodiment, the spin torque layer 362 can include a homogeneous conical magnetization material, i.e., a homogeneous material that provides a conical magnetization. As used herein, a "homogeneous" material refers to a material having a uniform material composition throughout. The thickness of the spin torque layer 362 can be in a range from 0.6 nm to 10 nm, such as from 1.2 nm to 5 nm, although lesser and greater thicknesses can also be employed.

A second nonmagnetic spacer layer 364 can be located on the spin torque layer 362 on the opposite side of the first nonmagnetic spacer layer 150. In one embodiment, the second nonmagnetic spacer layer 364 comprises an electrically insulating layer, such as magnesium oxide, having a thickness between 0.2 nm and 2 nm.

A spin polarization layer 366 can be provided on the second nonmagnetic spacer layer 364. In another embodiment, the order of formation of the spin torque layer 362 and the spin polarization layer 366 can be reversed, such that the spin polarization layer 366 is located closer to the free layer 136 than the spin torque layer 362. In general, a spin torque oscillator stack (e.g., an assist layer stack) 370 includes the second nonmagnetic spacer layer 364 located between the spin torque layer 362 and the spin polarization layer 366.

The spin polarization layer 366 has a conical magnetization, which is herein referred to as a second conical magnetization. The spin polarization layer 366 can include a single magnetic material layer or a plurality of magnetic material layers. The second conical magnetization of the spin polarization layer 366 can be provided by the single magnetic material layer having the second conical magnetization, or can be provided by a set of ferromagnetic material layers having an in-plane magnetization and a perpendicular (i.e., vertical or axial) magnetization. The second magnetic material has an in-plane magnetization component that is perpendicular to the fixed vertical magnetization (e.g., magnetization direction) of the reference layer 132. The in-plane magnetization component of the second magnetic material is antiferromagnetically coupled to the in-plane component of the first conical magnetization.

FIG. 2 illustrates an embodiment in which the spin polarization layer 366 consists of a single ferromagnetic material layer having the second conical magnetization with respect to a vertical direction that is parallel to the fixed vertical magnetization of the reference layer 132. In one embodiment, the azimuthally-dependent component of the magnetic anisotropy of the spin polarization layer 366 may be zero or insignificant compared to the thermal energy at room temperature, i.e., $k_B T$ in which $k_B$ is the Boltzmann constant and T is 297.15 Kelvin (which is the room temperature). For example, the maximum variation of the magnetic anisotropy energy per unit volume around a vertical axis that is parallel to the fixed vertical magnetization of the reference layer 132 can be less than ½ times the thermal energy at room temperature. In such cases, the conical magnetization of the spin polarization layer 366 is free to precess within the horizontal plane that is parallel to the interface between the first nonmagnetic spacer layer 150 and the spin torque layer 362 upon application of electrical current through the spin polarization layer 366. In one embodiment, the magnetic energy of the spin polarization layer 366 may be invariant under rotation of the magnetization of the spin polarization layer 366 within the horizontal plane.

In one embodiment, the spin polarization layer 366 can include any ferromagnetic film that provides a conical magnetization. For example, the spin polarization layer 366 can include a conical magnetization material such as rare-earth elements such as neodymium, erbium, or alloys of at least one rare-earth magnetic element and non-rare-earth element such as iron, boron, cobalt, copper, and/or zirconium. In one embodiment, the spin polarization layer 366 can include a homogeneous conical magnetization material, i.e., a homogeneous material that provides a conical magnetization. The ferromagnetic materials of the spin torque layer 362 and the spin polarization layer 366 may be the same or different. The thickness of the spin polarization layer 366 can be in a range from 0.6 nm to 10 nm, such as from 1.2 nm to 5 nm, although lesser and greater thicknesses can also be employed.

In case the magnetization of the spin polarization layer 366 is a conical magnetization, i.e., a second conical magnetization, the second conical magnetization of the spin polarization layer 366 can couple with the first conical magnetization of the spin torque layer 362 in various modes.

Figure 3:
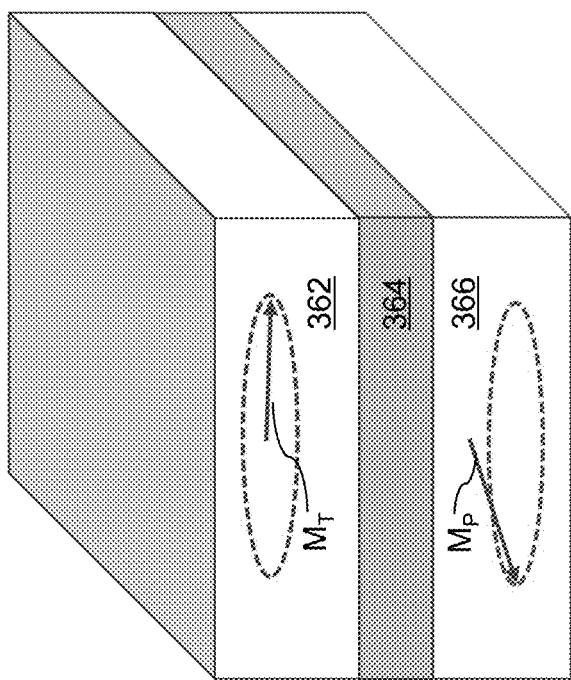
FIG. 3 illustrates antiferromagnetic coupling between the magnetization of a spin torque layer and a spin polarization layer within the exemplary spin-transfer torque MRAM cell in a first coupling mode.

FIG. 3 illustrates a first mode of the antiferromagnetic coupling between the first conical magnetization $M_T$ of the spin torque layer 362 and the second conical magnetization $M_P$ of the spin polarization layer 366 within the exemplary spin-transfer torque MRAM cell 180. FIG. 3 illustrates the relative alignment between the first conical magnetization $M_T$ of the spin torque layer 362 and the second conical magnetization $M_P$ of the spin polarization layer 366 at an instant during precessing. In the first mode, the vertical component of the first conical magnetization $M_T$ of the spin torque layer 362 and the vertical component of the second conical magnetization $M_P$ of the spin polarization layer 366 can be antiparallel to each other.

In this mode, the in-plane component of the first conical magnetization of the spin torque layer 362 and the in-plane magnetization component of the magnetization (which can be the second conical magnetization) of the spin polarization layer 366 can be antiferromagnetically aligned. In this mode, the in-plane component of the first conical magnetization of the spin torque layer 362 and the in-plane magnetization component of the magnetization of the spin polarization layer 366 are free to precess around a vertical axis that is parallel to the vertical direction (i.e., a direction that is parallel to the fixed vertical magnetization (e.g., magnetization direction) of the reference layer 132 and that is perpendicular to the various interfaces of the layer stack (120, 140, 150, 370, 170)) while maintaining antiferromagnetic alignment upon application of electrical current through the spin torque layer 362, the second nonmagnetic spacer layer 364, and the spin polarization layer 366. The fixed vertical magnetization of the reference layer 132 maintains a same orientation upon application of electrical current through the reference layer 132.

Figure 9:
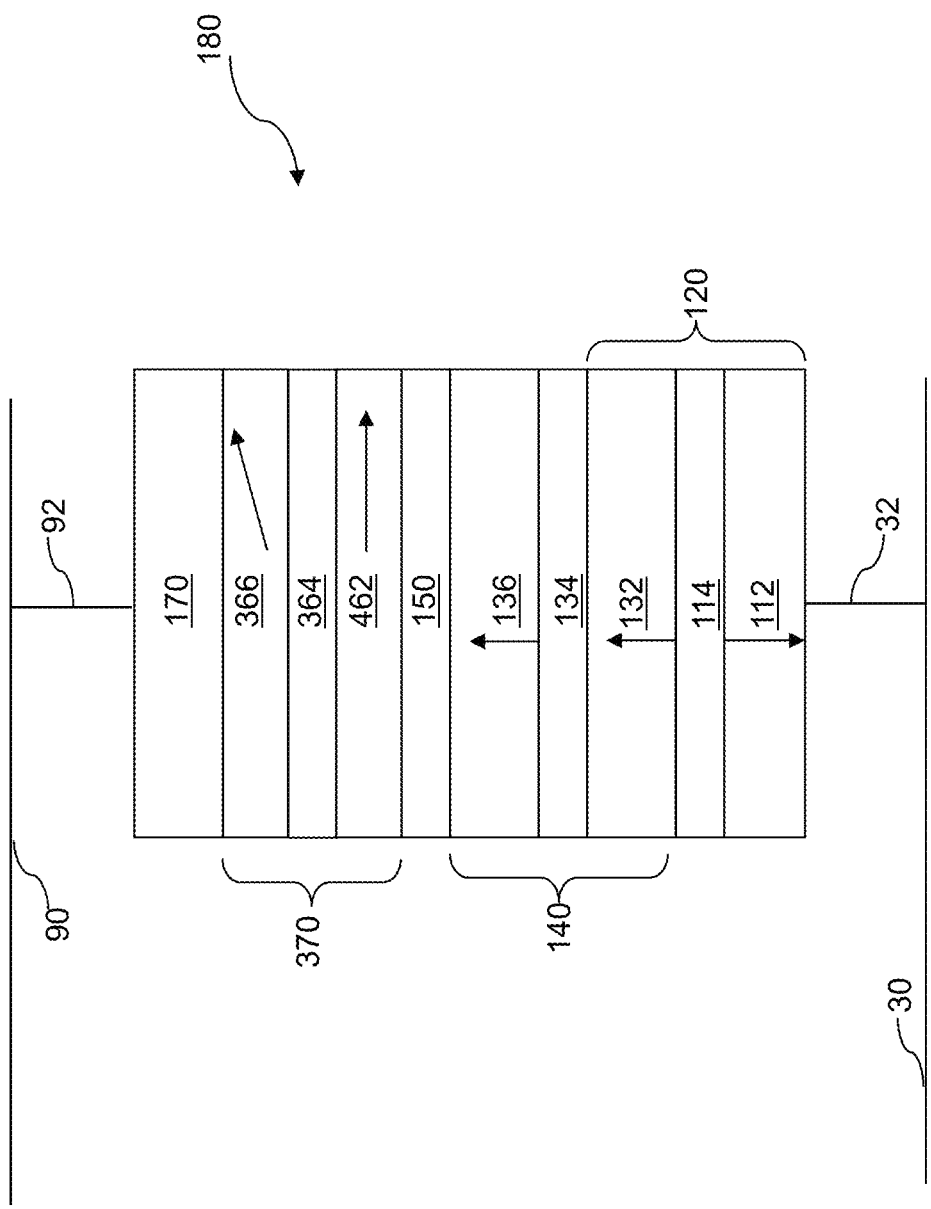
FIG. 9 illustrates a fourth configuration of an exemplary MRAM cell according to an embodiment of the present disclosure.

In FIG. 3, the magnetization $M_T$ of the spin torque layer 362 can be in a horizontal plane (as will be described in more detail with respect to the fourth embodiment below which is illustrated in FIG. 9) or the magnetization $M_T$ of the spin torque layer 362 can be conical and its cone angle (i.e., the angle between the vertical direction perpendicular to the interfaces between the various material layers and the vector representing the direction of the first conical magnetization $M_T$) and the cone angle of the second conical magnetization $M_P$ of the spin polarization layer 366 can remain the same during precessing of the first conical magnetization $M_T$ of the spin torque layer 362 and the second conical magnetization $M_P$ of the spin polarization layer 366, which occurs during programming of the magnetization of the free layer 136 (i.e., during flipping of the vertical magnetization of the free layer 136 from a parallel state to an antiparallel state or vice versa). In one embodiment, the relative angle between the total magnetization (i.e., the second conical magnetization) of the spin polarization layer 366 and the first conical magnetization of the spin torque layer 362 remains fixed at a value selected within a range from, and not including, 90 degrees to, and including, 180 degrees upon application of electrical current through the spin torque layer 362, the second nonmagnetic spacer layer 364, and the spin polarization layer 366.

Figure 4:
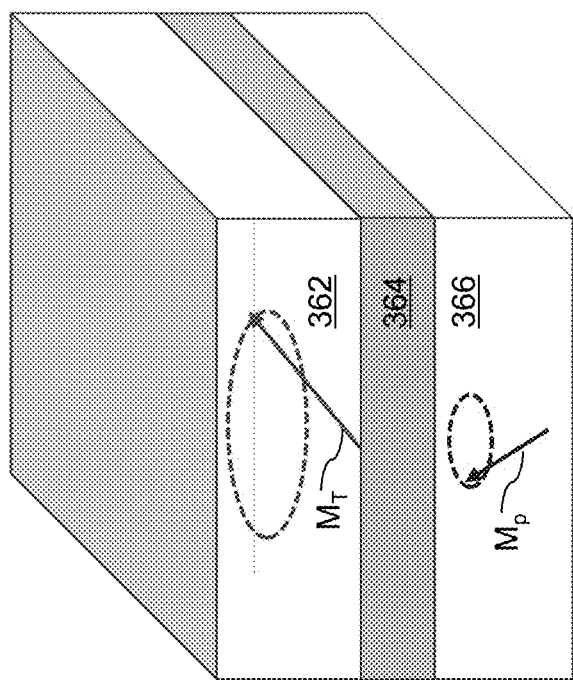
FIG. 4 illustrates antiferromagnetic coupling between the magnetization of a spin torque layer and a spin polarization layer within the exemplary spin-transfer torque MRAM cell in a second coupling mode.

FIG. 4 illustrates a second mode of the antiferromagnetic coupling between the first conical magnetization $M_T$ of the spin torque layer 362 and the second conical magnetization $M_P$ of the spin polarization layer 366 within the exemplary spin-transfer torque MRAM cell 180. FIG. 4 illustrates the relative alignment between the first conical magnetization $M_T$ of the spin torque layer 362 and the second conical magnetization $M_P$ of the spin polarization layer 366 at an instant during precessing. In the second mode, the vertical component of the first conical magnetization $M_T$ of the spin torque layer 362 and the vertical component of the second conical magnetization $M_P$ of the spin polarization layer 366 can be parallel to each other, i.e., both can point upward or both can point downward.

The cone angle of the first conical magnetization $M_T$ of the spin torque layer 362 (i.e., the angle between the vertical direction perpendicular to the interfaces between the various material layers and the vector representing the direction of the first conical magnetization $M_T$) and the cone angle of the second conical magnetization $M_P$ of the spin polarization layer 366 can vary during precessing of the first conical magnetization $M_T$ of the spin torque layer 362 and the second conical magnetization $M_P$ of the spin polarization layer 366. In one embodiment, a relative angle between the total magnetization (e.g., the second conical magnetization) of the spin polarization layer 366 and the first conical magnetization of the spin torque layer 362 varies within a range from, and not including, 90 degrees to, and including, 180 degrees upon application of electrical current through the spin torque layer 362, the second nonmagnetic spacer layer 364, and the spin polarization layer 366.

Figure 5:
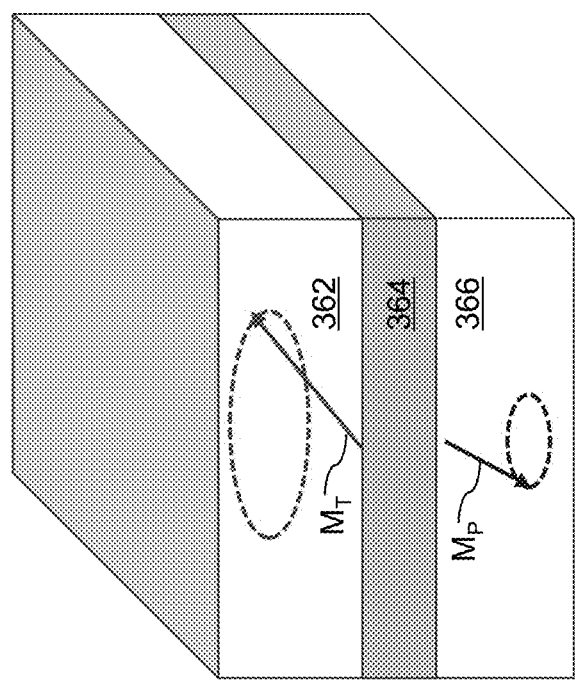
FIG. 5 illustrates antiferromagnetic coupling between the magnetization of a spin torque layer and a spin polarization layer within the exemplary spin-transfer torque MRAM cell in a third coupling mode.

FIG. 5 illustrates a third mode of the antiferromagnetic coupling between the first conical magnetization $M_T$ of the spin torque layer 362 and the second conical magnetization $M_P$ of the spin polarization layer 366 within the exemplary spin-transfer torque MRAM cell 180. FIG. 5 illustrates the relative alignment between the first conical magnetization $M_T$ of the spin torque layer 362 and the second conical magnetization $M_P$ of the spin polarization layer 366 at an instant during precessing. In the third mode, the vertical component of the first conical magnetization $M_T$ of the spin torque layer 362 and the vertical component of the second conical magnetization $M_P$ of the spin polarization layer 366 can be antiparallel to each other, i.e., one points upward and the other points downward.

The cone angle of the first conical magnetization $M_T$ of the spin torque layer 362 (i.e., the angle between the vertical direction perpendicular to the interfaces between the various material layers and the vector representing the direction of the first conical magnetization $M_T$) and the cone angle of the second conical magnetization $M_P$ of the spin polarization layer 366 can vary during precessing of the first conical magnetization $M_T$ of the spin torque layer 362 and the second conical magnetization $M_P$ of the spin polarization layer 366. In one embodiment, a relative angle between the total magnetization (e.g., the second conical magnetization) of the spin polarization layer 366 and the first conical magnetization of the spin torque layer 362 varies within a range from, and not including, 90 degrees to, and including, 180 degrees upon application of electrical current through the spin torque layer 362, the second nonmagnetic spacer layer 364, and the spin polarization layer 366.

Figure 6:
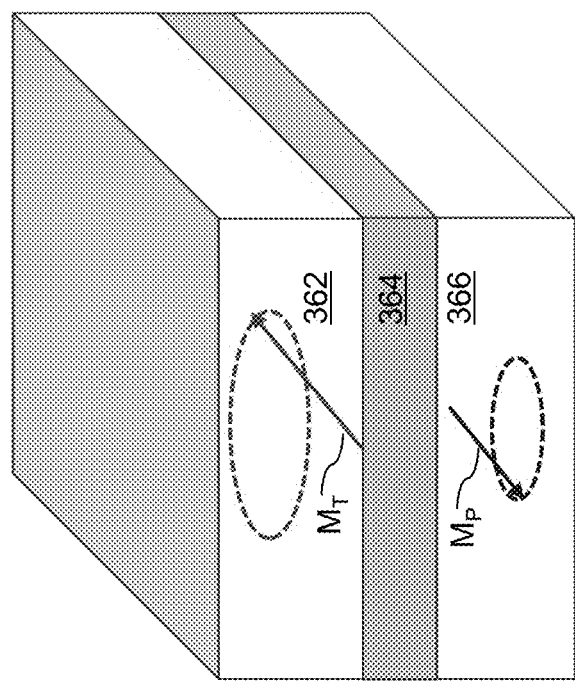
FIG. 6 illustrates antiferromagnetic coupling between the magnetization of a spin torque layer and a spin polarization layer within the exemplary spin-transfer torque MRAM cell in a fourth coupling mode.

FIG. 6 illustrates a fourth mode of the antiferromagnetic coupling between the first conical magnetization $M_T$ of the spin torque layer 362 and the second conical magnetization $M_P$ of the spin polarization layer 366 within the exemplary spin-transfer torque MRAM cell 180. FIG. 6 illustrates the relative alignment between the first conical magnetization $M_T$ of the spin torque layer 362 and the second conical magnetization $M_P$ of the spin polarization layer 366 at an instant during precessing. In the fourth mode, the vertical component of the first conical magnetization $M_T$ of the spin torque layer 362 and the vertical component of the second conical magnetization $M_P$ of the spin polarization layer 366 may antiparallel to each other and the frequency of the first and second magnetization is the same such that the first and second magnetization direction vectors point in opposite directions (e.g., when one points left, the other points right and vice-versa). Thus, the first and second magnetization directions are anti-parallel in both vertical and horizontal directions (e.g., both the vertical and horizontal components of the first and second conical magnetization directions are antiparallel) in the fourth mode.

This fourth mode results in a high amount of noise and is not preferred compared to the first, second and third modes. Thus, the first and second magnetization directions are preferably not antiparallel in both vertical and horizontal directions.

Referring back to FIG. 2, the spin polarization layer 366 can be provided as a single spin polarization layer having a homogeneous composition and can have the second conical magnetization with respective to the vertical direction. Generally, the single spin polarization layer can have an axial magnetization component that is parallel or antiparallel to an axial magnetization component of the first conical magnetization of the spin torque layer 362. In some embodiments, the spin polarization layer 366 can have an axial magnetization component (i.e., a vertical magnetization component) that is antiparallel to an axial component of the conical magnetization of the spin torque layer 362. In some embodiments, the spin polarization layer 366 can have an axial magnetization component (i.e., a vertical magnetization component) that is parallel to an axial component of the conical magnetization of the spin torque layer 362.

In one embodiment, a nonmagnetic capping layer 170 can be located over the spin polarization layer 366. The nonmagnetic capping layer 170 can include a nonmagnetic, electrically conductive material such as W, Ti, Ta, WN, TiN, TaN, Ru, and Cu. The thickness of the nonmagnetic capping layer 170 can be in a range from 1 nm to 20 nm, although lesser and greater thicknesses can also be employed.

The layer stack including the material layers from the SAF structure 120 to the nonmagnetic capping layer 170 can be deposited upward or downward, i.e., from the SAF structure 120 toward the nonmagnetic capping layer 170 or from the nonmagnetic capping layer 170 toward the SAF structure 120. The layer stack can be formed as a stack of continuous layers, and can be subsequently patterned into discrete patterned layer stacks for each MRAM cell 180.

MRAM cell 180 can include a first terminal 92 that is electrically connected to or comprises a portion of a bit line 90 (shown in FIG. 1) and second terminal 32 that is electrically connected to or comprises a portion of a word line 30 (shown in FIG. 1). The location of the first and second terminals may be switched such that the first terminal is electrically connected to the SAF structure 120 and the second terminal is electrically connected to the capping layer 170.

Optionally, each MRAM cell 180 can include a dedicated steering device, such an access transistor or diode configured to activate a respective discrete patterned layer stack (120, 140, 150, 162, 164, 166, 170) upon application of a suitable voltage to the steering device. The steering device may be electrically connected between the patterned layer stack and one of the respective word lines 30 or bit lines 90 of the respective MRAM cell 180.

In one embodiment, the polarity of the voltage applied to the first terminal 92 can be changed depending on the polarity of the magnetization state to be programmed in the free layer 136. For example, a voltage of a first polarity can be applied to the first terminal 92 (with respect to the second terminal 32) during a transition from an antiparallel state to a parallel state, and a voltage of a second polarity (which is the opposite of the first polarity) can be applied to the first terminal 92 during a transition from a parallel state to an antiparallel state. Further, variations in the circuitry for activating the discrete patterned layer stack (120, 140, 150, 162, 164, 166, 170) are also contemplated herein.

The magnetization direction of the free layer 136 can be flipped (i.e., from upward to downward or vice versa) by flowing electrical current through the discrete patterned layer stack (120, 140, 150, 362, 364, 366, 170). The magnetization direction of the free layer 136 can precess around the vertical direction (i.e., the direction of the flow of the electrical current) during the programming process until the direction of the magnetization flips by 180 degrees, at which point the flow of the electrical current stops.

The first conical magnetization of the spin torque layer 362 and the second conical magnetization of the spin polarization layer 366 are free to precess around a vertical axis that is parallel to the fixed vertical magnetization of the reference layer 132 upon application of electrical current through the spin torque layer 362, the second nonmagnetic spacer layer 364, and the spin polarization layer 366, e.g., during programming. The fixed vertical magnetization of the reference layer 132 maintains a same orientation upon application of electrical current through the reference layer 132.

During operation of the MRAM cell, electrical current can be flowed through the magnetic tunnel junction 140, the first nonmagnetic spacer layer 150, the spin torque layer 362, the second nonmagnetic spacer layer 364, and the spin polarization layer 366. The spin torque oscillator stack 370 comprising the combination of the spin torque layer 362, the second nonmagnetic spacer layer 364, and the spin polarization layer 366 is configured to provide an initial non-vertical torque to a magnetization of the free layer 136 during an initial phase of precession of the magnetization of the free layer 136 around a vertical axis that is parallel to the fixed vertical magnetization of the reference layer 132 upon initiation of flow of electrical current through the MRAM cell 180. The MRAM cell 180 is configured to provide magnetic coupling between the magnetization of the free layer 136 and the first magnetization of the spin torque layer 362 during precession of the magnetization of the free layer 136 around a vertical axis that is parallel to the fixed vertical magnetization of the reference layer 132, and to provide synchronized precession of the first magnetization of the spin torque layer 362 and the magnetization of the free layer 136 while electrical current flows through the MRAM cell 180.

Figure 7:
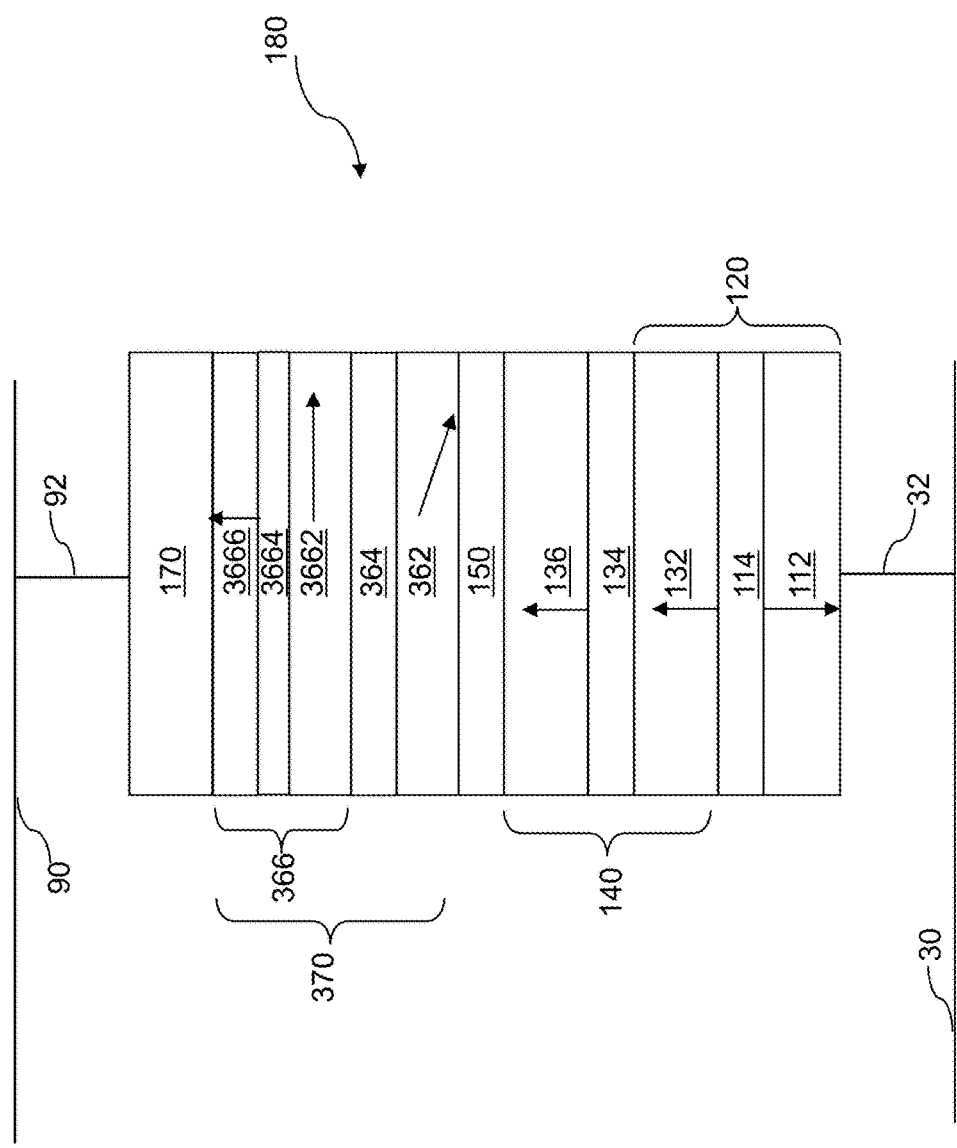
FIG. 7 illustrates a second configuration of an exemplary an MRAM cell according to an embodiment of the present disclosure.

Referring to FIG. 7, a second configuration of the exemplary spin-transfer torque MRAM cell 180 is illustrated. The spin polarization layer 366 includes a layer stack of multiple layers (3662, 3664, 3666) having different material compositions. The spin polarization layer 366 includes a layer stack of a first spin polarization component layer 3662 having a magnetization that is the same as the in-plane magnetization component of the second conical magnetization. The first spin polarization component layer 3662 can have a zero magnetic anisotropy or negative uniaxial magnetic anisotropy so that the magnetization of the first spin polarization component layer 3662 is parallel to the interfaces among the various layers of the MRAM cell 180.

In one embodiment, the first spin polarization component layer 3662 comprises, and/or consists essentially of, a cobalt-iridium alloy. The material composition of the cobalt-iridium alloy can be selected to provide negative uniaxial magnetic anisotropy. In one embodiment, the cobalt-iridium alloy can include cobalt atoms at an atomic concentration in a range from 60% to 98%, such as from 70% to 90%, and iridium atoms at the atomic concentration of the balance. In an illustrative example, a cobalt-iridium alloy having a composition of $Co_{0.8}Ir_{0.2}$ has a $K_1$ value of about $-0.6 \times 10^6$ $J/m^3$. In another embodiment, the first spin polarization component layer 3662 comprises, and/or consists essentially of, a cobalt-iron alloy. The material composition of the cobalt-iron alloy can be selected to provide negative uniaxial magnetic anisotropy. In one embodiment, the cobalt-iron alloy can include cobalt atoms at an atomic concentration in a range from 80% to 99.8%, such as from 90% to 99.5%, and iron atoms at the atomic concentration of the balance. In an illustrative example, a cobalt-iron alloy having a composition of $Co_{0.9}Ir_{0.1}$ has a $K_1$ value of about $-0.99 \times 10^6$ $J/m^3$. In another embodiment, the first spin polarization component layer 3662 comprises, and/or consists essentially of, a cobalt-iron-boron (CoFeB) alloy. The thickness of the first spin polarization component layer 3662 can be in a range from 1 nm to 10 nm, such as from 1.5 nm to 6 nm, although lesser and greater thicknesses can also be employed.

In another embodiment, the first spin polarization component layer 3662 includes a multiplayer stack containing multiple repetitions of a first magnetic material layer and a second magnetic material layer. The first magnetic material layer can include, and/or can consist essentially of, a first magnetic material. The second magnetic material layer can include, and/or can consist essentially of, a second magnetic material.

In one embodiment, the first magnetic material layers comprise cobalt, and the second magnetic material layers comprise iron. In one embodiment, the first magnetic material layers consist essentially of cobalt, and the second magnetic material layers consist essentially of iron. The thickness of each first magnetic material layer can be in a range from 0.3 nm to 1 nm, and the thickness of each second magnetic material layer can be in a range from 0.3 nm to 1 nm. The total number of repetitions (i.e., the total number of pairs of a first magnetic material layer and a second magnetic material layer) within the first spin polarization component layer 3662 can be in a range from 2 to 20, such as from 4 to 10. In one embodiment, the multilayer stack comprises a periodic repetition of a unit layer stack that includes a first magnetic material layer and a second magnetic material layer. In an illustrative example, an interlaced cobalt-iron multilayer stack including repetitions of a unit layer stack consisting of a cobalt layer and an iron layer having the same thickness can have a $K_1$ value of about $-1.1 \times 10^6$ $J/m^3$.

The spin polarization layer 366 further includes a second spin polarization component layer 3666 having an axial magnetization that is parallel or antiparallel to the vertical direction of the reference layer 132. In one embodiment, the second spin polarization component layer 3666 includes a multilayer stack of cobalt layers and either platinum or palladium layers. The second spin polarization component layer 3666 can have a positive uniaxial magnetic anisotropy so that the magnetization of the second spin polarization component layer 3666 is axial, i.e., perpendicular to the interfaces among the various layers of the MRAM cell 180. The axial magnetization of the second spin polarization component layer 3666 can be parallel or antiparallel to the fixed vertical direction of magnetization of the reference layer 132.

In one embodiment, the second spin polarization component layer 3666 can be vertically spaced from the first spin polarization component layer 3662 by an optional third nonmagnetic spacer layer 3664. The third nonmagnetic spacer layer 3664 can include a nonmagnetic material such as MgO, Cu, Ag, AgSn, Cr, or Ge. In one embodiment, the first spin polarization component layer 3662 can be in contact with the second nonmagnetic spacer layer 364.

In this case, the combined magnetization of the first spin polarization component layer 3662 and the second spin polarization component layer 3666 provides the second conical magnetization, which is free to rotate (e.g., oscillate) around the vertical axis during programming of the MRAM cell 180. In this case, the combined magnetization of the first spin polarization component layer 3662 and the second spin polarization component layer 3666 provides an additional conical magnetization (i.e., the second conical magnetization) that is coupled to the first conical magnetization of the spin torque layer 362. During programming, the second conical magnetization and the first conical magnetization precess around a vertical axis that is parallel to the vertical direction of the magnetization of the reference layer 132 upon application of electrical current through the spin torque layer 362, the second nonmagnetic spacer layer 364, and the spin polarization layer 366. The mode of coupling between the first conical magnetization and the second conical magnetization is preferably any of the first, second or third modes illustrated in FIGS. 3-5.

Figure 8:
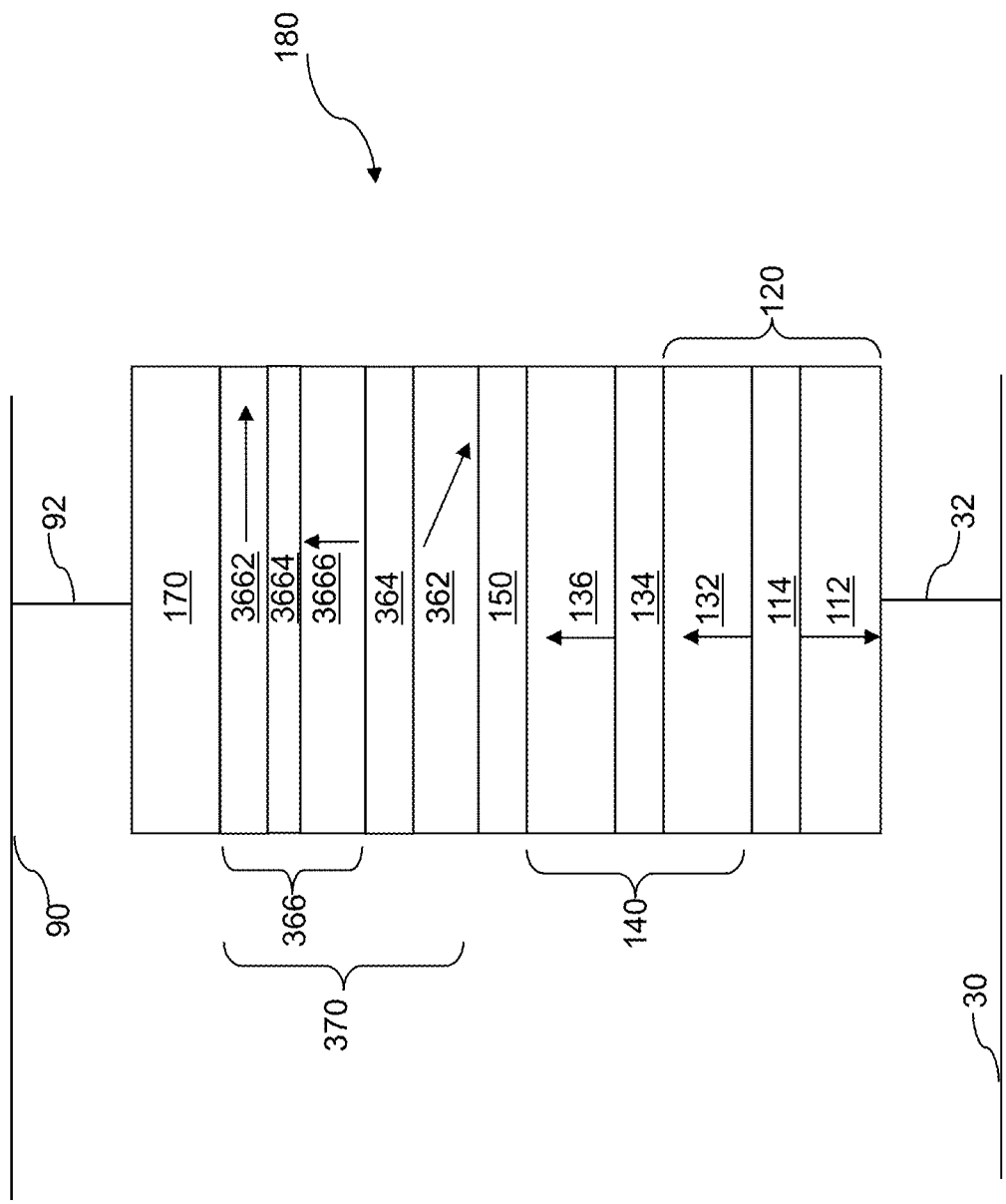
FIG. 8 illustrates a third configuration of an exemplary MRAM cell according to an embodiment of the present disclosure.

Referring to FIG. 8, a third configuration of the exemplary spin-transfer torque MRAM cell 180 according to an embodiment of the present disclosure can be derived from the second configuration of the exemplary spin-transfer torque MRAM cell 180 by exchanging the positions of the first spin polarization component layer 3662 and the second spin polarization component layer 3666. In this case, the second spin polarization component layer 3666 can be in contact with the second nonmagnetic spacer layer 364. The exemplary spin-transfer torque MRAM cell 180 in the third configuration can operate in the same manner as the exemplary spin-transfer torque MRAM cells 180 in the first and second configurations.

FIG. 9 illustrates a fourth configuration of an exemplary spin-transfer torque MRAM cell 180 according to an embodiment of the present disclosure. The fourth configuration of the exemplary spin-transfer torque MRAM cell 180 can be derived from the first, second, and third configuration of the exemplary spin-transfer torque MRAM cell 180 by substituting a spin torque layer 462 having an in-plane magnetization (i.e., having negative uniaxial magnetic anisotropy) in place of the spin torque layer 362 having a first conical magnetization. In other words, the axial component of the magnetization of the spin torque layer 462 can be zero, and the magnetization (e.g., magnetization direction) of the spin torque layer 462 can consist of an in-plane component. In this case, the total magnetization of the spin torque layer 462 is the same as the in-plane magnetization component of the spin torque layer 462.

In one embodiment, the spin torque layer 462 comprises a homogeneous negative uniaxial magnetic anisotropy material. As used herein, a "homogeneous" material refers to a material having a uniform material composition throughout. In one embodiment, the spin torque layer 462 comprises, and/or consists essentially of, a cobalt-iridium alloy. The material composition of the cobalt-iridium alloy can be selected to provide negative uniaxial magnetic anisotropy. In one embodiment, the cobalt-iridium alloy can include cobalt atoms at an atomic concentration in a range from 60% to 98%, such as from 70% to 90%, and iridium atoms at the atomic concentration of the balance. In an illustrative example, a cobalt-iridium alloy having a composition of $Co_{0.8}Ir_{0.2}$ has a $K_1$ value of about $-0.6\times106$ J/m$^3$. In another embodiment, the spin torque layer 462 comprises, and/or consists essentially of, a cobalt-iron alloy. The material composition of the cobalt-iron alloy can be selected to provide negative uniaxial magnetic anisotropy. In one embodiment, the cobalt-iron alloy can include cobalt atoms at an atomic concentration in a range from 80% to 99.8%, such as from 90% to 99.5%, and iron atoms at the atomic concentration of the balance. In an illustrative example, a cobalt-iron alloy having a composition of $Co_{0.9}Ir_{0.1}$ has a $K_1$ value of about $-0.99\times10^6$ J/m$^3$. In another embodiment, the spin torque layer 462 comprises, and/or consists essentially of, a cobalt-iron-boron (CoFeB) alloy. The thickness of the spin torque layer 462 can be in a range from 1 nm to 10 nm, such as from 1.5 nm to 6 nm, although lesser and greater thicknesses can also be employed.

In another embodiment, the spin toque layer 462 includes a multiplayer stack containing multiple repetitions of a first magnetic material layer and a second magnetic material layer. The first magnetic material layer can include, and/or can consist essentially of, a first magnetic material. The second magnetic material layer can include, and/or can consist essentially of, a second magnetic material.

In one embodiment, the first magnetic material layers comprise cobalt, and the second magnetic material layers comprise iron. In one embodiment, the first magnetic material layers consist essentially of cobalt, and the second magnetic material layers consist essentially of iron. The thickness of each first magnetic material layer can be in a range from 0.3 nm to 1 nm, and the thickness of each second magnetic material layer can be in a range from 0.3 nm to 1 nm. The total number of repetitions (i.e., the total number of pairs of a first magnetic material layer and a second magnetic material layer) within the spin torque layer 462 can be in a range from 2 to 20, such as from 4 to 10. In one embodiment, the multilayer stack comprises a periodic repetition of a unit layer stack that includes a first magnetic material layer and a second magnetic material layer. In an illustrative example, an interlaced cobalt-iron multilayer stack including repetitions of a unit layer stack consisting of a cobalt layer and an iron layer having the same thickness can have a $K_1$ value of about $-1.1\times10^6$ J/m$^3$. The spin torque layer 462 may be used with any of the spin polarization layers 366 described above with respect to the first through third embodiments.

The various embodiment combinations of a spin torque layer (362 or 462) and a spin polarization layer 366 provide the benefit of reduction in the current density for making the parallel to antiparallel transition and in the current density for making the antiparallel to parallel transition by providing initial non-vertical torque to the magnetization of the free layer 136 during an initial phase of precession of the magnetization of the free layer 136 around a vertical axis that is parallel to the fixed vertical magnetization of the reference layer 132 upon initiation of flow of electrical current through the MRAM cell 180.

Specifically, during the writing process with current flowing across the stack of the MRAM cell 180, magnetization of both the spin torque layer and the spin polarization layer are oscillating at high frequency with a cone angle (the angle between the magnetization and the normal axis of the stack layer interfaces) between 0 and 90 degrees, as shown in FIGS. 2 to 6. The oscillating magnetization of spin torque layer can have one or more of the following non-limited benefits leading to lower switching current for the free layer 136. First, an in-plane component of the spin torque layer 362 magnetization that is orthogonal to the initial magnetization of the free layer 136 may produce a large spin torque on the free layer 136 to help its initial precession. Second, the oscillating magnetization of the spin torque layer 362 may lead to rotation of the aforementioned torque, which helps to maximize the assist effect throughout the precessional switching process of the free layer 136. Third, a direct field produced by the spin torque layer 362 magnetization in the free layer 136 may be largely an in-plane AC field, which is also orthogonal to the free layer's initial magnetization direction. Thus, this also helps provide the rotating torque to assist free layer 136 switching.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A MRAM cell, comprising:
    a magnetic tunnel junction comprising a reference layer having a fixed magnetization direction, a free layer, and a nonmagnetic tunnel barrier layer located between the reference layer and the free layer;
    a spin torque oscillator stack; and
    a first nonmagnetic spacer layer located between the free layer and the spin torque oscillator stack,
    wherein:
    the spin torque oscillator stack comprises a spin torque layer, a spin polarization layer and a second nonmagnetic spacer located between the spin torque layer and the spin polarization layer;
    the spin torque layer comprises a first magnetic material having a first conical magnetization with respect to a vertical axis that is parallel to the fixed vertical magnetization direction of the reference layer; and an in-plane component of the first conical magnetization is free to precess around the vertical axis upon application of current through the spin torque layer, the second nonmagnetic spacer layer, and the spin polarization layer.

2. The MRAM cell of claim 1, wherein the spin torque layer is located on the first nonmagnetic spacer layer, the second nonmagnetic spacer layer is located on the spin torque layer, and the spin polarization layer is located on the second nonmagnetic spacer layer.

3. The MRAM cell of claim 1, further comprising a nonmagnetic capping layer located over the spin polarization layer and comprising a metallic material.

4. The MRAM cell of claim 1, wherein the spin torque oscillator stack is configured to provide an initial non-vertical torque to a magnetization of the free layer during an initial phase of precession of the magnetization of the free layer around a vertical axis that is parallel to the fixed vertical magnetization direction of the reference layer upon initiation of flow of current through the MRAM cell.

5. The MRAM cell of claim 1, wherein the spin torque layer is more proximal to the first nonmagnetic spacer layer than the spin polarization layer is to the first nonmagnetic spacer layer.

6. The MRAM cell of claim 1, wherein the spin torque layer is in direct contact with the first nonmagnetic spacer layer.

7. The MRAM cell of claim 1, wherein the spin polarization layer comprises a second magnetic material having a second conical magnetization with respect to the vertical axis that is parallel to the fixed vertical magnetization direction of the reference layer.

8. The MRAM cell of claim 7, wherein an in-plane component of the second conical magnetization is free to precess around the vertical axis upon application of current through the spin torque layer, the second nonmagnetic spacer layer, and the spin polarization layer.

9. The MRAM cell of claim 7, wherein the fixed vertical magnetization direction of the reference layer maintains a same orientation upon application of electrical current through the reference layer.

10. The MRAM cell of claim 7, wherein the spin polarization layer comprises a ferromagnetic material having the second conical magnetization with respect to the vertical axis.

11. The MRAM cell of claim 10, wherein the ferromagnetic material has an axial magnetization component that is parallel or antiparallel to an axial magnetization component of the first conical magnetization of the spin torque layer.

12. The MRAM cell of claim 1, wherein the spin polarization layer comprises:
a first spin polarization component layer having zero or negative magnetization; and
a second spin polarization component layer having an axial magnetization that is parallel or antiparallel to the vertical axis.

13. The MRAM cell of claim 12, wherein the second spin polarization component is vertically spaced from the first spin polarization component layer by a third nonmagnetic spacer layer.

14. The MRAM cell of claim 12, wherein the second spin polarization component comprises a multilayer stack of cobalt layers and at least one of platinum or palladium layers.

15. The MRAM cell of claim 14, wherein the first spin polarization component comprises a cobalt-iridium alloy comprising 70 to 90 atomic percent cobalt and 10 to 30 atomic percent iridium.

16. The MRAM device of claim 14, wherein the first spin polarization component comprises a cobalt-iron alloy comprising 90 to 99.5 atomic percent cobalt and 0.5 to 10 atomic percent iron.

17. The MRAM device of claim 14, wherein the first spin polarization component comprises a cobalt-iron-boron alloy.

18. The MRAM device of claim 14, wherein the first spin polarization component comprises a multilayer stack of cobalt layers and iron layers.

19. The MRAM device of claim 14, wherein a combined magnetization of the first spin polarization component layer and the second spin polarization component layer provides the second conical magnetization that is coupled to the first conical magnetization of the spin torque layer.

20. A method of operating the MRAM device of claim 1, comprising programming the MRAM device by flowing the current through the magnetic tunnel junction, the spin torque oscillator stack and the first nonmagnetic spacer layer,
wherein the in-plane component of the first conical magnetization is free to precess around the vertical axis when the current flows through the magnetic tunnel junction, the spin torque oscillator stack and the first nonmagnetic spacer layer.

* * * * *